(12) United States Patent
Anderson

(10) Patent No.: US 6,861,846 B2
(45) Date of Patent: Mar. 1, 2005

(54) DISTORTION MEASUREMENTS WITH A VECTOR NETWORK ANALYZER

(75) Inventor: Keith Frederick Anderson, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 76 days.

(21) Appl. No.: 10/320,934

(22) Filed: Dec. 16, 2002

(65) Prior Publication Data

US 2004/0113632 A1 Jun. 17, 2004

(51) Int. Cl.[7] .......................... G01R 31/00; G01R 23/20
(52) U.S. Cl. ....................... 324/623; 324/601; 324/620; 324/638
(58) Field of Search ................................ 324/623, 616, 324/601, 612, 650, 620, 638; 702/69, 85

(56) References Cited

U.S. PATENT DOCUMENTS

| | | | |
|---|---|---|---|
| 5,191,294 A | * | 3/1993 | Grace et al. ................. 324/613 |
| 6,249,128 B1 | * | 6/2001 | Begg .......................... 324/601 |
| 6,292,000 B1 | | 9/2001 | Kapetanic et al. .......... 324/623 |
| 6,316,945 B1 | | 11/2001 | Kapetanic et al. .......... 324/623 |
| 6,396,287 B1 | | 5/2002 | Kapetanic et al. .......... 324/623 |
| 6,529,844 B1 | * | 3/2003 | Kapetanic et al. ............ 702/85 |

OTHER PUBLICATIONS

Agilent Technologies, Inc. 2002; Agilent AN 1287–3; Applying Error Correction To Network Analyzer Measurements; Application Note; Mar. 27, 2002; pp. 1–16.

* cited by examiner

Primary Examiner—N. Le
Assistant Examiner—John Teresinski
(74) Attorney, Agent, or Firm—John L. Imperato

(57) ABSTRACT

A distortion measurement method uses alternative measurements to determine the distortion of a DUT, depending on the ratio of the distortion at an output of the DUT to distortion of a source stimulating the DUT. The method includes calibrating the VNA at a distortion frequency, measuring a first gain of the DUT with the source and the receivers of the VNA set to the distortion frequency, and measuring a second gain of the DUT with the source of the VNA set to a fundamental frequency and the receivers of the VNA set to the distortion frequency. When the second gain is less than a predesignated threshold, a match-corrected source signal is acquired and used with the first gain and the second gain to determine the distortion of the DUT. When the second gain is not less than the predesignated threshold, a match-corrected DUT output signal is measured and used with the first gain and the second gain to determine the distortion of the DUT.

21 Claims, 7 Drawing Sheets

US 6,861,846 B2

DISTORTION MEASUREMENTS WITH A VECTOR NETWORK ANALYZER

FIELD OF THE INVENTION

This invention relates to vector network analyzers, and particularly, to measuring distortion using vector network analyzers.

BACKGROUND OF THE INVENTION

Vector network analyzers (VNAs) include a signal source to stimulate a device under test (DUT) and one or more tuned receivers to measure responses of the DUT to the stimuli provided by the source. Traditionally, VNAs measure transmission and/or reflection responses of the DUTs, with the receivers tuned to perform measurements at the same frequency as the source. Modern VNAs with offset tuning capabilities enable the frequencies of the source and the receivers to be set independently. Thus, the VNA can stimulate the DUT at one or more fundamental frequencies while measuring the response of the DUT at frequencies that are different from the fundamental frequencies, such as harmonic frequencies, subharmonic frequencies, frequencies of intermodulation (IM) distortion products, or other distortion signals. However, since the source supplying the stimuli to the DUT at the fundamental frequencies typically provides unwanted distortion signals due to limitations in spectral purity of the source, measuring the distortion generated by the DUT using the VNA involves accounting for the distortion signals that are attributable to the source.

Kepetanic et al. (U.S. Pat. Nos. 6,416,945 B1; 6,396,287 B1; 6,292,000 B1) disclose processes for determining relative harmonic levels of a DUT using a VNA. Kepetanic et al. relies on a vector difference equation, which includes a ratio of an output harmonic level to a harmonic level from the source, to determine these relative harmonic levels. When the harmonic levels of the source are sufficiently low to be on the order of the noise floor of the source and the receivers of the VNA, the determination of the relative harmonic levels becomes susceptible to errors, because the denominator of the ratio is influenced by the noise floor of the VNA. Accordingly, there is a need for distortion measurements that accommodate for both low level and high level harmonics from a source.

SUMMARY OF THE INVENTION

A distortion measurement method constructed according to the embodiments of the present invention uses alternative measurements to determine the distortion of a DUT, depending on the ratio of the distortion at an output of the DUT to distortion of a source stimulating the DUT. The method includes calibrating the VNA at a distortion frequency, measuring a first gain of the DUT with the source and the receivers of the VNA set to the distortion frequency, and measuring a second gain of the DUT with the source of the VNA set to a fundamental frequency and the receivers of the VNA set to the distortion frequency. When the second gain is less than a predesignated threshold, a match-corrected source signal is acquired and used with the first gain and the second gain to determine the distortion of the DUT. When the second gain is not less than the predesignated threshold, a match-corrected DUT output signal is measured and used with the first gain and the second gain to determine the distortion of the DUT.

DETAILED DESCRIPTION OF THE EMBODIMENTS

Figure 1:
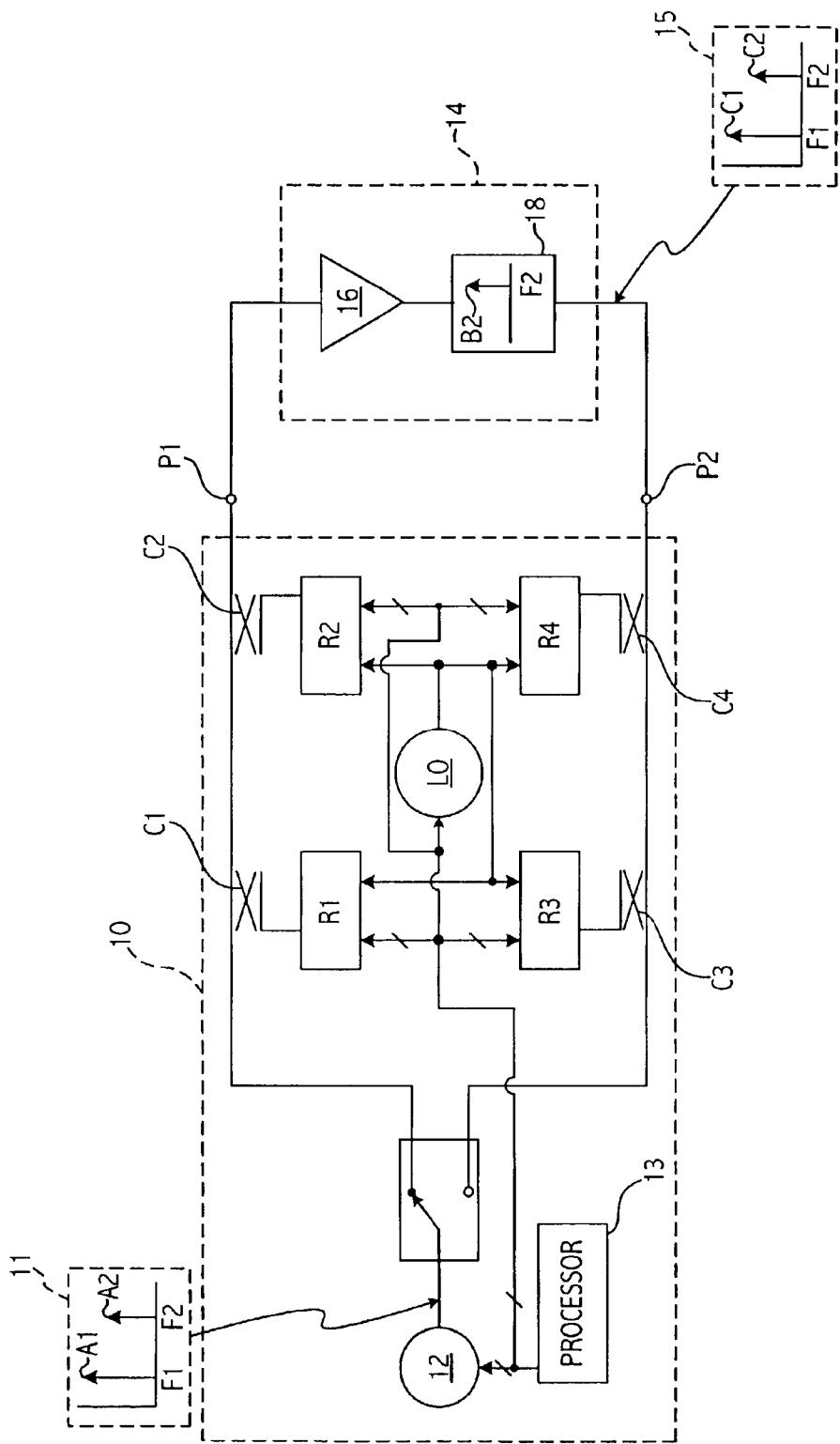
FIG. 1 shows a VNA suitable for performing distortion measurements of a DUT in accordance with the embodiments of the present invention.

FIG. 1 shows a VNA 10, including a source 12, one or more tuned receivers R1–R4, and a processor 13. The VNA is suitable for performing distortion measurements of a DUT 14 according to the embodiments of the present invention. The VNA 10 has two or more measurement ports P1, P2, and the DUT 14 is shown coupled to the ports P1, P2. The receivers R1–R4 enable transmission and/or reflection responses to be measured at each of the ports P1, P2 through directional couplers C1–C4. Offset tuning of the receivers R1–R4 enables the receivers R1–R4 to be tuned, or set, to receive and process signals at frequencies that are independent of the frequencies to which the source12 is set. In this example, tuning of the receivers R1–R4 is achieved via one or more local oscillators LO. One example of the VNA is the model E5071A Network Analyzer provided by AGILIENT TECHNOLOGIES, INC., of Palo Alto, Calif., USA.

In FIG. 1, the source 12 provides a stimulus 11 having a fundamental signal A1 at a fundamental frequency F1 and a distortion signal A2 at a distortion frequency F2 when the source 12 is set to the fundamental frequency F1, typically due to limitations in spectral purity of the source 12. The fundamental frequency F1 is a single frequency, a series of frequencies, or a frequency range designating the fundamentals in the distortion measurement of the DUT 14. The distortion frequency F2 is a single frequency, a series of frequencies, or a frequency range having harmonic or subharmonic relationships to the fundamental signal A1 at the fundamental frequency F1, being intermodulation (IM) distortion products of multiple fundamental signals A1, or being any other distortion product of the fundamental signal A1 at the fundamental frequency F1.

The DUT 14 is represented by a gain block 16 cascaded with a distortion mechanism 18 that generates a distortion signal B2 at the distortion frequency F2. The gain block 16 has a gain G2 at the distortion frequency F2. At the output of the DUT 14 a resulting output signal 15 has a fundamental signal C1 at fundamental frequency F1 and a distortion signal C2 at the frequency distortion frequency F2. (Vector quantities are indicated in bold type, whereas magnitudes of the vector quantities are scalar quantities indicated by the operator "| |"). In one example, the distortion signal B2 of the DUT 14 represents a subharmonic, or a $2^{nd}$, $3^{rd}$, $4^{th}$ or higher order harmonic of the fundamental signal A1. In another example, when the fundamental signal A1 includes a first fundamental signal A1 at the fundamental frequency F1 and a second signal A1' at a second fundamental frequency F1', the distortion signal B2 of the DUT 14 represents a first $3^{rd}$ order IM distortion product at a first distortion frequency F2=2*F1−F1' and a second 3$^{rd}$ order IM distortion product at a second distortion frequency F2'=2*F1'−F1.

Figure 2:
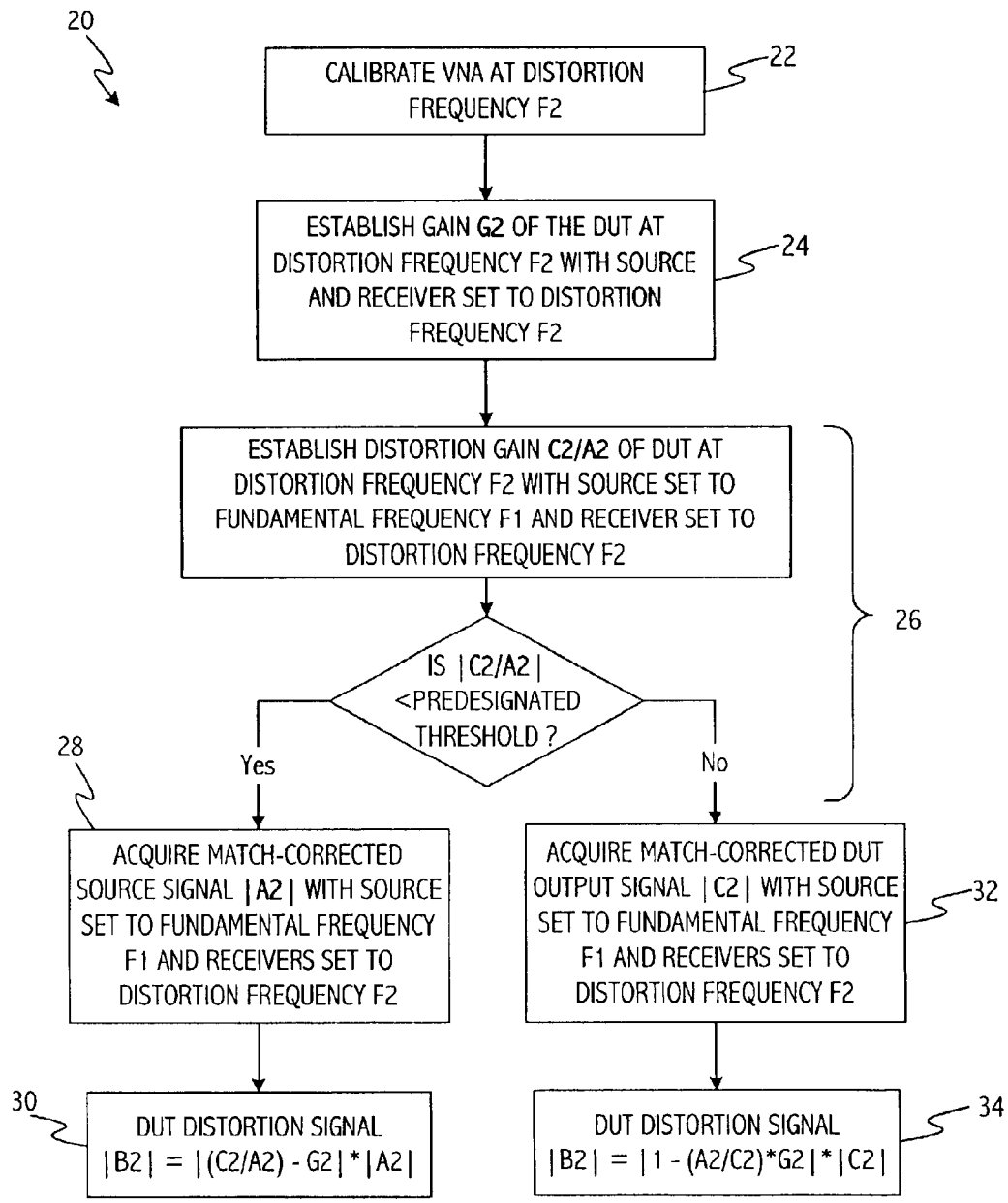
FIG. 2 is a flow diagram of a distortion measurement method constructed according to the embodiments of the present invention.
Figure 3A:
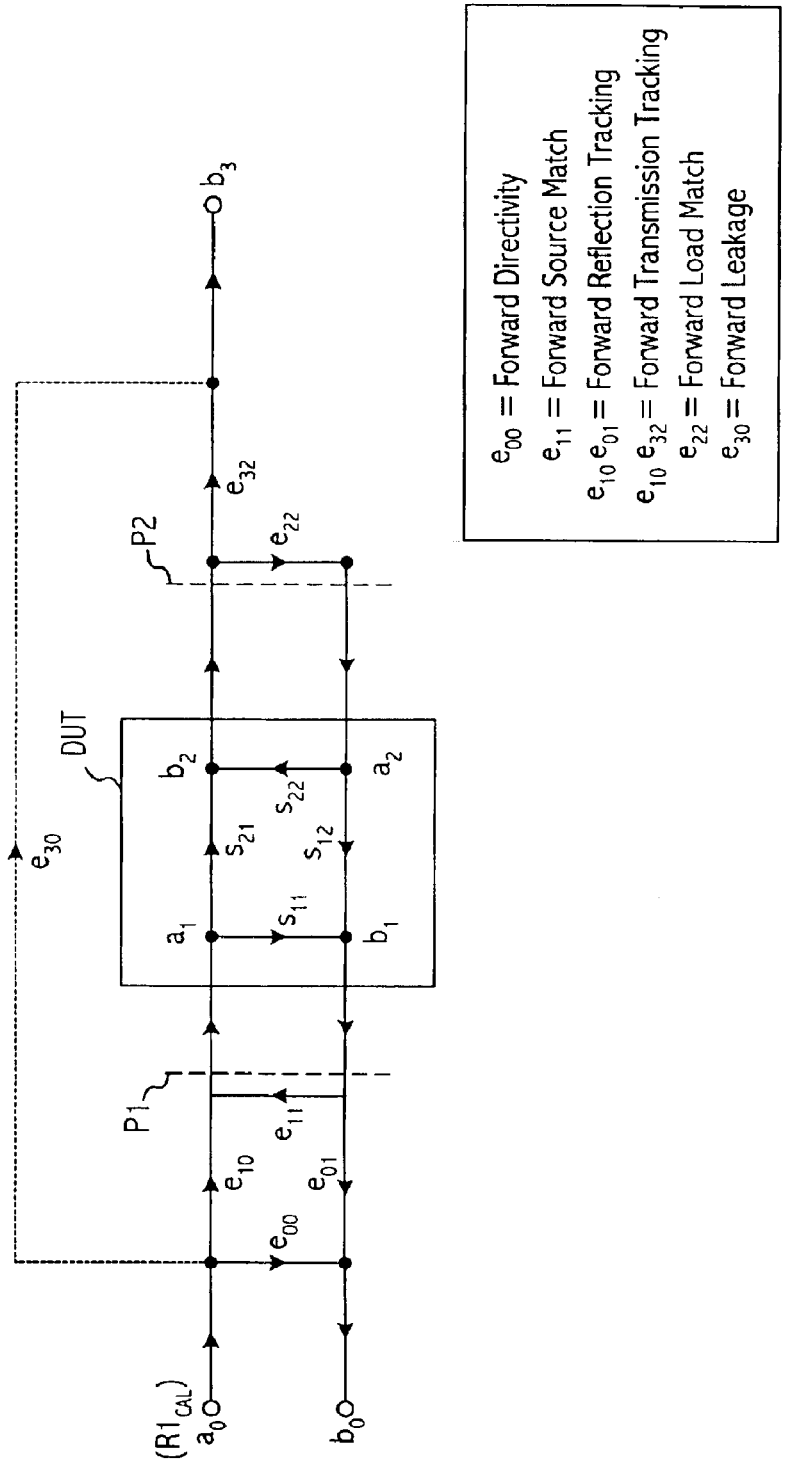
FIGS. 3A–3B are signal flow graphs for the VNA of FIG. 1, including the DUT and indicating correction factors for the VNA.
Figure 3B:
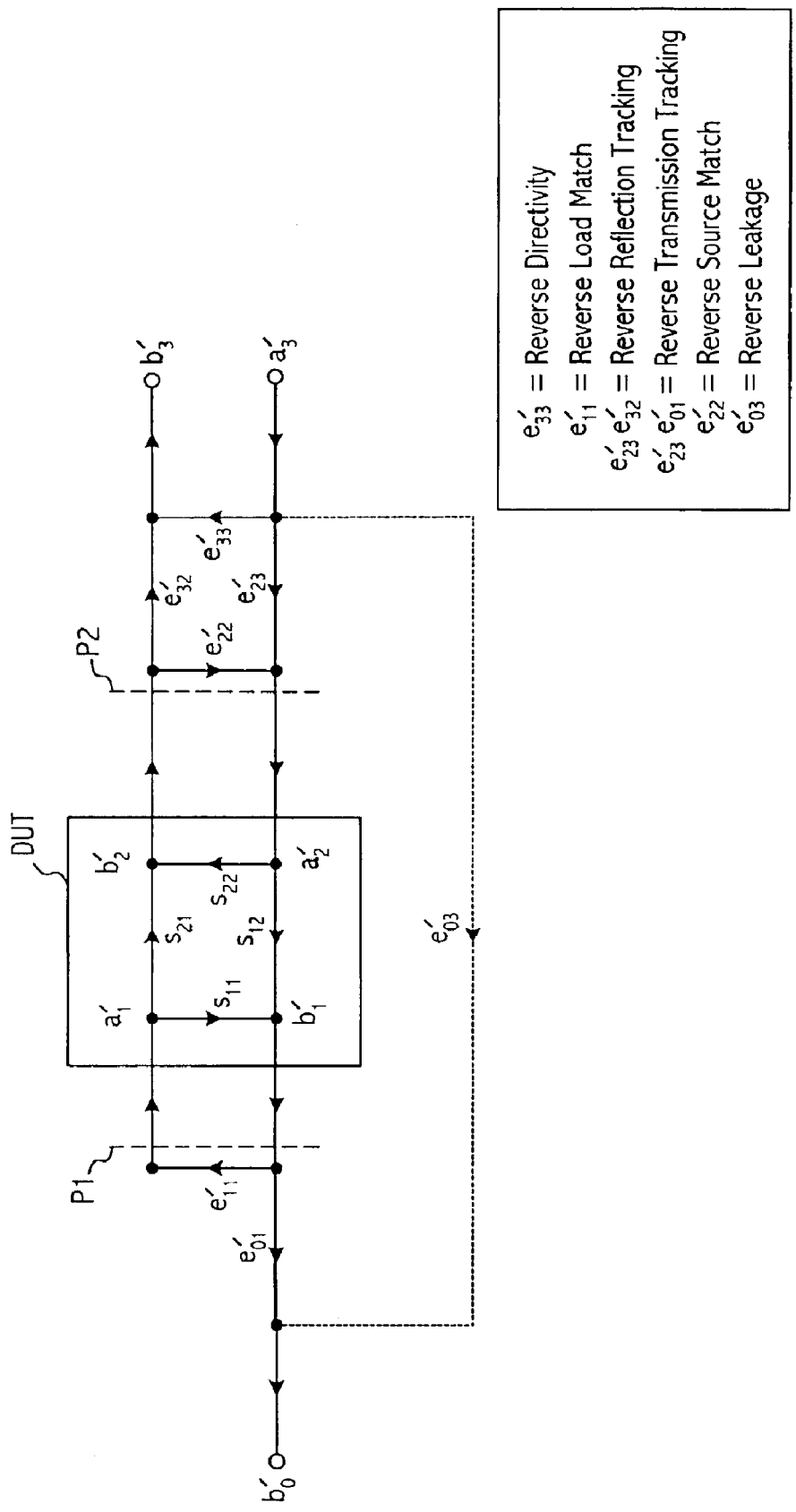

FIG. 2 is a flow diagram of a method 20 constructed according to the embodiments of the present invention. In step 22 of the method 20, the VNA 10 (hereinafter "VNA") is calibrated at the distortion frequency F2. During the calibration of the VNA in step 22, the DUT 14 (hereinafter "DUT") is typically decoupled from the VNA, and the source 12 and receivers R1–R4 are each set to the same frequencies. The VNA calibration includes an S-parameter calibration and a power calibration performed at the distortion frequency F2. Various S-parameter calibration methods are known in the art and typically include a full two-port vector calibration of the VNA using open, short, thru, and load calibration standards. Examples of suitable S-parameter calibrations are taught in an Application Note AN-1287-3, available from AGILIENT TECHNOLOGIES, INC., of Palo Alto, Calif., USA, and include establishing forward transmission tracking represented by the vector product e10*e32, forward load match represented by the vector e22, forward source match represented by the vector e11, and other correction factors at the distortion frequency F2. FIG. 3A shows an example of a signal flow graph for the VNA of FIG. 1, including the DUT and indicating forward correction factors for the VNA. FIG. 3B shows an example of a signal flow graph for the VNA of FIG. 1, including the DUT and indicating reverse correction factors for the VNA.

As an alternative to the open, short, thru, load type of calibration for the VNA, TRL types of calibration using calibration standards such as thru, reflection and transmission lines, or any other calibration scheme that establishes the correction factors for the VNA is suitable for inclusion in step 22.

The power calibration included in the calibration of the VNA in step 22 typically involves the processor 13 adjusting the amplitude of the source 12 to a calibration signal level at the distortion frequency F2, and measuring power Pmeas of the signal provided by the source 12 at the distortion frequency F2 using a power meter or other power measurement system (not shown) coupled to the port P1 of the VNA. The match Γpm of the power meter is measured by the VNA at the port P1 at the distortion frequency F2, and the receiver R1 measures a signal R1$_{CAL}$ in response to a signal that is provided by the source 12 to the power meter at the distortion frequency F2.

A magnitude correction term |e10| at the distortion frequency F2 is derived from the measured power Pmeas, the match Γpm, the measured signal R1$_{CAL}$, and the forward source match e11 of the VNA, according to the relationship:

$$|e10|=P\text{meas}^{1/2}*|1-\Gamma pm*e11|/|R1_{CAL}|.$$

Once the magnitude correction term |e10| is obtained, the magnitude correction term |e32| at the distortion frequency F2 is derived as the ratio of the magnitude of the forward transmission tracking |e10*e32| to the magnitude correction term |e10|.

In step 24 of the method 20, the gain G2 of the DUT is established at the distortion frequency F2, with the source and the receivers both set to the distortion frequency F2. The gain G2 is, typically represented by the forward transmission scattering parameter (S-parameter) S21, measured with the DUT operating linearly. For high accuracy, correction factors (shown in FIGS. 3A–3B) resulting from the S-parameter calibration of step 22 are applied, and the measured S-parameters S11$m$, S22$m$, S12$m$, S21$m$ of the DUT, acquired at the distortion frequency F2 with the DUT coupled between the ports P1, P2 of the VNA are also accounted for in the measurement of the gain G2. In this example, the gain G2 of the DUT at the distortion frequency F2 is established according to the relationship:

$$G2=((S21m\text{-}e30)/(e10e32))(1+(S$$
$$22m\text{-}e'33)(e'22\text{-}e22)/(e'23e'32))/((1+$$
$$(S11m\text{-}e00)e11/(e10e01))(1+(S$$
$$22m\text{-}e'33)e'22/(e'23e'32))\text{-}e'$$
$$11e22(S21m\text{-}e30)(S12m\text{-}e'03)/(e$$
$$10e32e'23e'01))$$

where the source 12 and the receivers R1–R4 are set to the distortion frequency F2.

In step 26, the distortion gain C2/A2 of the DUT is established at distortion frequency F2 with the source 12 set to the fundamental frequency F1 and the receivers R1–R4 set to the distortion frequency F2. This distortion gain C2/A2 is typically represented by the forward transmission S-parameter S21 at the distortion frequency F2. For high accuracy, correction factors (shown in FIGS. 3A–3B) resulting from the S-parameter calibration of step 22 are applied, and the measured S-parameters S11$m$, S22$m$, S12$m$, S21$m$ of the DUT acquired at the distortion frequency F2 with the DUT coupled between the ports P1, P2 of the VNA are also accounted for in the measurement of the gain C2/A2. In this example, the distortion gain C2/A2 of the DUT at the distortion frequency F2 is established according to the relationship:

$$C2/A2=((S21m\text{-}e30)/(e10e32))(1+(S22m\text{-}e$$
$$'33)(e'22\text{-}e22)/(e'23e'32))/((1+(S11\ m\text{-}$$
$$e00)e11/(e10e01))(1+(S22m\text{-}e'33)e'$$
$$22/(e'23e'32))\text{-}e'11e22(S21m\text{-}e30)(S$$
$$12m\text{-}e'03)/(e10e32e'23e'01))$$

where the source 12 is set to the fundamental frequency F1 and the receivers R1–R4 are set to the distortion frequency F2.

From the distortion gain C2/A2, a magnitude |C2/A2| of the measured distortion gain C2/A2 is also determined in step 26. When the magnitude |C2/A2| of the distortion gain C2/A2 is less than a predesignated threshold, step 28 and step 30 are performed following step 26. When the magnitude |C2/A2| of the distortion gain C2/A2 is not less than the predesignated threshold, step 32 and step 34 are performed following step 26. In one example, the threshold is designated as unity, but other values for the threshold are alternatively designated based on the noise performance of the source 12 and the receivers R1–R4, or according to the measurement sensitivity of the VNA.

Figure 4:
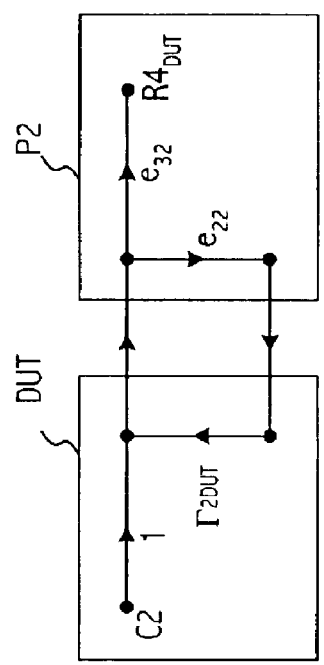
FIG. 4 is a signal flow graph indicating a match-corrected DUT output signal used in the distortion measurement method constructed according to the embodiments of the present invention.

In step 32, a match-corrected DUT output signal |C2| is acquired at the distortion frequency F2 with the source 12 set to the fundamental frequency F1 and the receiver R4 set to the distortion frequency F2. FIG. 4 is a signal flow graph indicating the distortion signal C2, the correction term e32, the forward load match e22, the output impedance match $\Gamma_{2DUT}$ of the DUT measured by the VNA at the distortion frequency F2 with the input of the DUT terminated by the port P1 of the VNA, and a measured signal R4$_{DUT}$ at the output of the DUT measured by the receiver R4 with the DUT coupled between the port P1 and the port P2 of the VNA. The measured signal $R4_{DUT}$ is corrected for the forward load match e22 and the magnitude correction term |e32|, which are known from the S-parameter calibration performed in step 22, and the output impedance match $\Gamma_{2DUT}$, to establish the match-corrected DUT output signal |C2| according to the relationship:

$$|C2|=|R4_{DUT}|*|1-\Gamma_{2DUT}*e22|/|e32|,$$

where $\Gamma_{2DUT}=S22+(S21*S12*e11)/(1-S11*e11)$.

Figure 5:
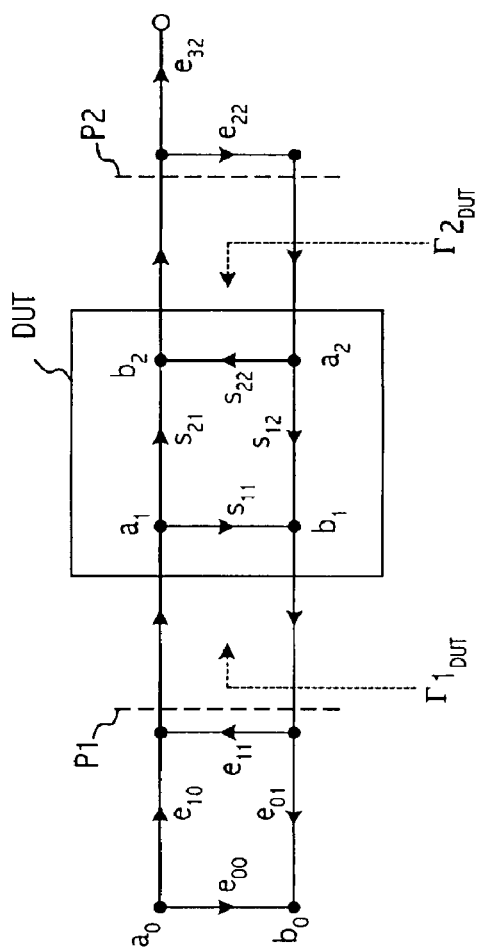
FIG. 5 is a signal flow graph indicating the impedance matches of the DUT.

FIG. 5 is an example of a signal flow graph indicating the impedance match $\Gamma_{2DUT}$ at the output of the DUT, the forward source match e11 of the VNA, and the S-parameters of the DUT. While one accommodation for the impedance matches of the DUT and the VNA has been presented, correcting measurements for impedance matches within a network or system is known in the art, and any scheme that accommodates or otherwise compensates for these impedance matches is suitable for use to acquire the match-corrected DUT output signal |C2| at the distortion frequency F2 in step 32.

Once the match-corrected DUT output signal |C2| at the distortion frequency F2 is obtained in step 32, the magnitude of the DUT distortion signal |B2| at the distortion frequency F2 is obtained in step 34, according to the relationship:

$$|B2|=|1-(A2/C2)*G2|*|C2|.$$

Figure 6:
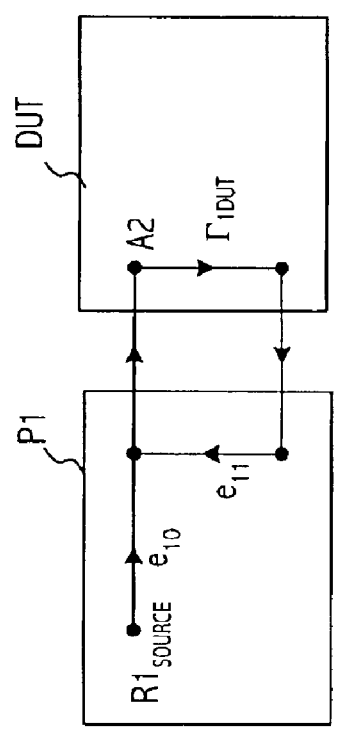
FIG. 6 is a signal flow graph indicating a match-corrected source signal used in the distortion measurement method constructed according to the embodiments of the present invention.

When the magnitude |C2/A2| of the distortion gain C2/A2 is less than the predesignated threshold, step 28 and step 30 are performed following step 26. In step 28, a match-corrected source signal |A2| is acquired at the distortion frequency F2. The match-corrected source signal |A2| is the magnitude of the distortion signal A2 at the distortion frequency F2 with the DUT coupled between the port P1 and the port P2 of the VNA, with the source 12 set to the fundamental frequency F1. FIG. 6 is a signal flow graph indicating the distortion signal A2, the forward source match e11, the correction term e10, an input match $\Gamma_{1DUT}$ of the DUT measured by the VNA at the distortion frequency F2 with the output of the DUT terminated by the port P2 of the VNA, and a measurement $R1_{SOURCE}$ by the receiver R1 at the distortion frequency F2 of the signal 11 provided by the source 12, with the source set to the fundamental frequency F1, with the DUT coupled between the port P1 and the port P2 of the VNA. This measurement $R1_{SOURCE}$ is then corrected for the forward source match e11 and the magnitude correction term |e10|, which are known from the S-parameter calibration performed in step 22, and the input impedance match $\Gamma_{1DUT}$ to establish the match-corrected source signal |A2| according to the relationship:

$$|A2|=|R1_{SOURCE}||e10|/|1-e11*\Gamma_{1DUT}|$$

where the input match $\Gamma_{1DUT}=S11+(S21*S12*e22)/(1-S22*e22)$.

FIG. 5 shows an example of a signal flow graph indicating the impedance match $\Gamma_{1DUT}$ at the input of the DUT, the forward load match e22 of the VNA, and the S-parameters of the DUT. While one accommodation for impedance matches of the DUT and the VNA has been presented, correcting measurements for impedance matches within a network or system is known in the art, and any scheme that accommodates or otherwise compensates for these impedance matches is suitable for use in the measurement of the match-corrected source signal |A2| at the distortion frequency F2 in step 28.

Once the match-corrected source signal |A2| at the distortion frequency F2 is obtained in step 28, the magnitude of the DUT distortion signal |B2| at the distortion frequency F2 is obtained in step 30, according to the relationship:

$$|B2|=|(C2/A2)-G2|*|A2|.$$

Once the DUT distortion signal |B2| is obtained from step 30 or step 34, a relative harmonic level is readily established by performing a measurement of the fundamental signal |C1| at the output of the DUT and taking the ratio of the DUT distortion signal |B2| to the fundamental signal |C1|. However, the DUT distortion signal |B2| is suitably included in any of a variety of subsequent measurements or manipulations where determination of the magnitude of the DUT distortion signal |B2| is of use.

In an alternative embodiment of the present invention, the method 20 is implemented in a VNA, where the processor 13, either internal or external to the VNA, sets the frequency of the source 12 and tunes the receivers R1–R4 to the fundamental frequency F1 and the distortion frequency F2, and performs the calculations and manipulations of measurements by the receivers R1–R4 to establish the gain G2, the distortion gain C2/A2, compare the magnitude |C2/A2| to the predesignated threshold, acquire the match-corrected source signal |A2|, the match-corrected DUT output signal |C2| and determine the distortion signal B2 of the DUT. In yet another embodiment of the present invention, the method 20 is implemented as a computer-readable medium encoded with a computer program that instructs a computer to perform the method 20 for measuring the distortion signal |B2| of the DUT with the VNA.

While the embodiments of the present invention have been illustrated in detail, it should be apparent that modifications and adaptations to these embodiments may occur to one skilled in the art without departing from the scope of the present invention as set forth in the following claims.

What is claimed is:

1. A method for measuring a distortion signal of a DUT with a VNA including a source, comprising:
   (a) calibrating the VNA at a distortion frequency;
   (b) establishing a first gain of the DUT at the distortion frequency with the source set to the distortion frequency;
   (c) establishing a second gain of the DUT at the distortion frequency with the source set to a fundamental frequency; and
   (d) acquiring a match-corrected source signal at the distortion frequency with the source set to the fundamental frequency to determine the distortion signal of the DUT when the magnitude of the second gain is less than a predetermined threshold, and acquiring a match-corrected DUT output signal at the distortion frequency with the source set to the fundamental frequency to determine the distortion signal of the DUT when the magnitude of the second gain is not less than the predetermined threshold.

2. The method of claim 1 wherein (a) includes an S-parameter calibration and a power calibration of the VNA.

3. The method of claim 2 wherein the distortion signal of the DUT is a magnitude of the difference between the second gain and the first gain, times the match-corrected source signal when the magnitude of the second gain is less than the predetermined threshold, and wherein the distortion signal of the DUT is a magnitude of one minus an inverse of the second gain times the first gain, times the magnitude of the match-corrected DUT output signal when the magnitude of the second gain is not less than the predetermined threshold.

4. The method of claim 1 wherein the distortion signal of the DUT is a magnitude of the difference between the second gain and the first gain, times the match-corrected source signal when the magnitude of the second gain is less than the predetermined threshold, and wherein the distortion signal of the DUT is a magnitude of one minus an inverse of the second gain times the first gain, times the magnitude of the match-corrected DUT output signal when the magnitude of the second gain is not less than the predetermined threshold.

5. The method of claim 1 wherein the distortion signal of the DUT is at least one of a subharmonic, a harmonic, and an intermodulation product of the fundamental frequency.

6. The method of claim 1 wherein the first gain is a function of scattering parameters of the DUT at the distortion frequency acquired with the DUT coupled to the VNA, and a series of correction factors established from (a).

7. The method of claim 1 wherein the second gain is a function of scattering parameters of the DUT at the distortion frequency acquired with the DUT coupled to the VNA, and a series of correction factors acquired from (a).

8. The method of claim 1 wherein the match-corrected DUT output signal includes a measurement at the distortion frequency of a signal at the output of the DUT with the DUT coupled to the VNA, corrected by a forward load match of the VNA acquired from (a), an output impedance match of the DUT at the distortion frequency with the DUT coupled to the VNA, and a magnitude component of a forward transmission tracking acquired from (a).

9. The method of claim 1 wherein the match-corrected source signal is a measurement at the distortion frequency of a signal provided to an input of the DUT by the source, with the source set to the fundamental frequency and with the DUT coupled to the VNA, corrected by a forward source match of the VNA acquired from (a), an input impedance match of the DUT at the distortion frequency with the DUT coupled to the VNA, and a magnitude component of a forward transmission tracking acquired from (a).

10. The method of claim 1 wherein the source and the one or more receivers are included in a VNA having a calibration at the distortion frequency.

11. The system of claim 10 wherein the calibration of the VNA includes an S-parameter calibration and a power calibration at the distortion frequency.

12. The system of claim 11 wherein the distortion signal of the DUT is a magnitude of the difference between the second gain and the first gain, times the match-corrected source signal when the magnitude of the second gain is less than the predetermined threshold, and wherein the distortion signal of the DUT is a magnitude of one minus an inverse of the second gain times the first gain, times the magnitude of the match-corrected DUT output signal when the magnitude of the second gain is not less than the predetermined threshold.

13. The system of claim 10 wherein the match-corrected DUT output signal includes a measurement at the distortion frequency of a signal at the output of the DUT with the DUT coupled to the VNA, corrected by a forward load match of the VNA acquired from (a), an output impedance match of the DUT at the distortion frequency with the DUT coupled to the VNA, and a magnitude component of a forward transmission tracking acquired from the calibration of the VNA at the distortion frequency.

14. The system of claim 10 wherein the the match-corrected source signal is a measurement at the distortion frequency of a signal provided to an input of the DUT by the source, with the source set to the fundamental frequency and with the DUT coupled to the VNA, corrected by a forward source match of the VNA acquired from the calibration of the VNA at the distortion frequency, an input impedance match of the DUT at the distortion frequency with the DUT coupled to the VNA, and a magnitude component of a forward transmission tracking acquired from the calibration of the VNA at the distortion frequency.

15. A system for measuring a distortion signal of a DUT, comprising:

a source, coupled to the DUT, adjustable to at least one of a fundamental frequency and a distortion frequency;

one or more receivers measuring a first gain of the DUT at the distortion frequency with the source set to the distortion frequency and measuring a second gain of the DUT at the distortion frequency with the source set to the fundamental frequency, the receivers acquiring a match-corrected source signal at the distortion frequency with the source set to the fundamental frequency when the magnitude of the second gain is less than a predetermined threshold, and acquiring a match-corrected DUT output signal at the distortion frequency with the source set to the fundamental frequency when the magnitude of the second gain is not less than the predetermined threshold; and a processor determining the distortion signal of the DUT according to the match-corrected source signal when the magnitude of the second gain is less than a predetermined threshold, and determining the distortion signal of the DUT according to the match-corrected DUT output signal when the magnitude of the second gain is not less than the predetermined threshold.

16. The system of claim 15 wherein the distortion signal of the DUT is a magnitude of the difference between the second gain and the first gain, times the match-corrected source signal when the magnitude of the second gain is less than the predetermined threshold, and wherein the distortion signal of the DUT is a magnitude of one minus an inverse of the second gain times the first gain, times the magnitude of the match-corrected DUT output signal when the magnitude of the second gain is not less than the predetermined threshold.

17. The system of claim 15 wherein the distortion signal of the DUT is at least one of a subharmonic, a harmonic, and an intermodulation product of the fundamental frequency.

18. The system of claim 15 wherein the first gain is a function of scattering parameters of the DUT at the distortion frequency acquired with the DUT coupled to the VNA, and a series of correction factors established from the calibration of the VNA at the distortion frequency.

19. The system of claim 15 wherein the second gain is a function of scattering parameters of the DUT at the distortion frequency acquired with the DUT coupled to the VNA, and a series of correction factors acquired from the calibration of the VNA at the distortion frequency.

20. A computer-readable medium encoded with a computer program that instructs a computer to perform a method for measuring a distortion signal of a DUT with a VNA, the method comprising:

(a) calibrating the VNA at a distortion frequency;

(b) establishing a gain (G2) of the DUT at the distortion frequency with a source of the VNA set to the distortion frequency;

(c) establishing a distortion gain (C2/A2) of the DUT at the distortion frequency with the source of the VNA set to a fundamental frequency; and (d) acquiring a match-corrected source signal (|A2|) at the distortion frequency with the source set to the fundamental frequency to determine the distortion signal (|B2|) of the DUT when the magnitude of the distortion gain (C2/A2) is less than a predetermined threshold, and acquiring a match-corrected DUT output signal (|C2|) at the distortion frequency with the source set to the fundamental frequency to determine the distortion signal (|B2|) when the magnitude of the distortion gain (C2/A2) is not less than the predetermined threshold.

21. The computer-readable medium of claim 20, wherein the distortion signal (|B2|) is determined to be |(C2/A2)−G2|*|A2| when the magnitude of the distortion gain (C2/A2) is less than a predetermined threshold, and wherein the distortion signal (|B2|) is determined to be |1−(A2/C2)*G2|*|C2| when the magnitude of the distortion gain (C2/A2) is not less than the predetermined threshold.

* * * * *